United States Patent [19]
Shyu et al.

[11] Patent Number: 5,675,294
[45] Date of Patent: Oct. 7, 1997

[54] SINGLE PIN CRYSTAL OSCILLATOR CIRCUIT

[75] Inventors: Jyn-Bang Shyu, Cupertino; Jin Zhao, Milpitas, both of Calif.

[73] Assignee: Sierra Semiconductor, San Jose, Calif.

[21] Appl. No.: 582,881

[22] Filed: Jan. 4, 1996

[51] Int. Cl.[6] ........................................ H03B 5/36
[52] U.S. Cl. .................... 331/75; 331/59; 331/108 D; 331/116 FE; 331/158
[58] Field of Search ...................... 331/74, 75, 108 D, 331/116 R, 116 FE, 158, 59

[56] References Cited

U.S. PATENT DOCUMENTS

| | | | |
|---|---|---|---|
| 3,833,823 | 9/1974 | Cecchin et al. | 327/58 |
| 4,571,558 | 2/1986 | Gay et al. | 331/116 R |
| 4,661,785 | 4/1987 | Benjaminson | 331/158 |
| 4,870,383 | 9/1989 | Nordholt | 331/158 |
| 5,416,448 | 5/1995 | Wessendorf | 331/116 R |

*Primary Examiner*—Siegfried H. Grimm
*Attorney, Agent, or Firm*—Burns, Doane, Swecker & Mathis, LLP

[57] ABSTRACT

A single pin integrated oscillator circuit includes an amplifier having a first input terminal to which an external crystal may be connected, and a second input terminal which receives a feedback path from an output terminal of the amplifier. An oscillator output signal having a relatively large voltage swing is provided from the first input terminal through a buffer. The oscillator operates over a wide range of voltages and process variations, and it can accept an input signal from an external crystal or can accept any clock signal having a swing of approximately 1 V.

10 Claims, 2 Drawing Sheets

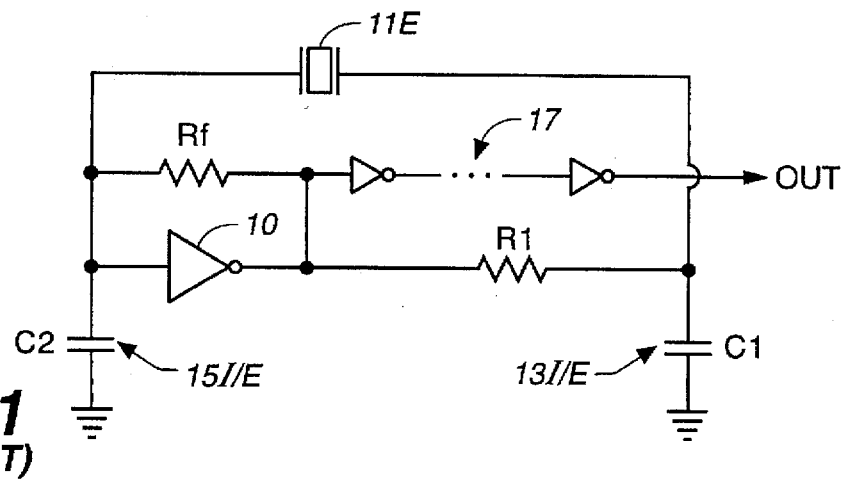
FIG._1
*(PRIOR ART)*
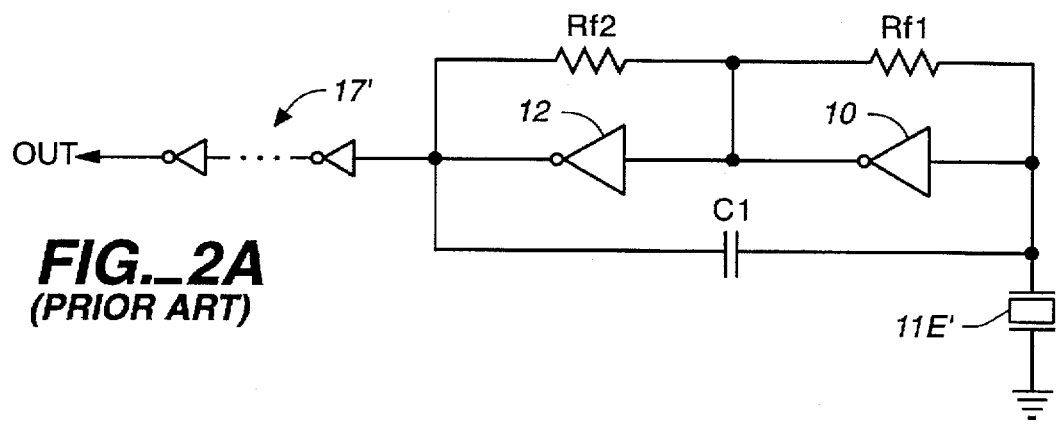
FIG._2A
*(PRIOR ART)*
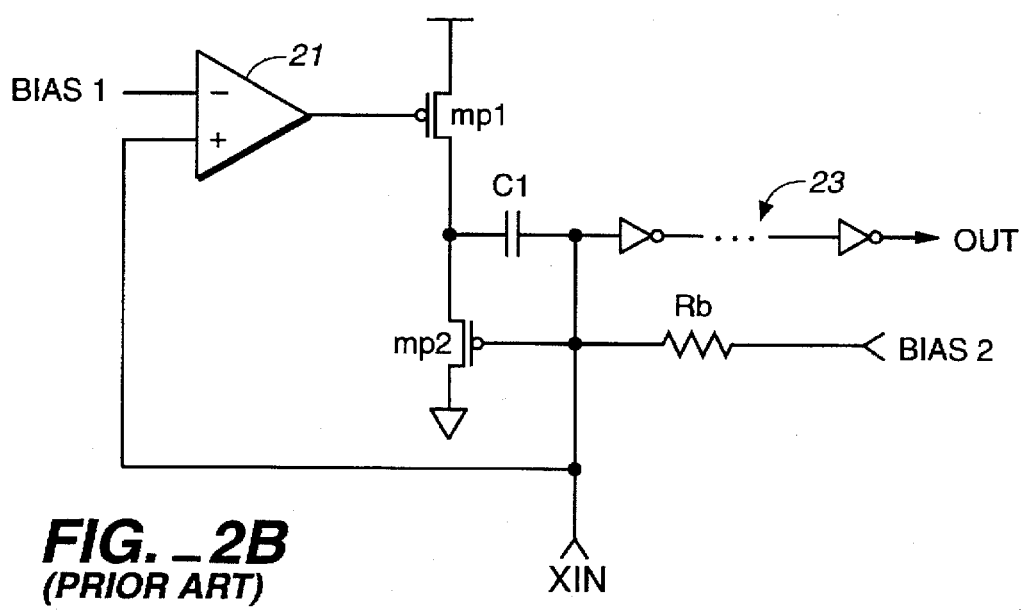
FIG._2B
*(PRIOR ART)*

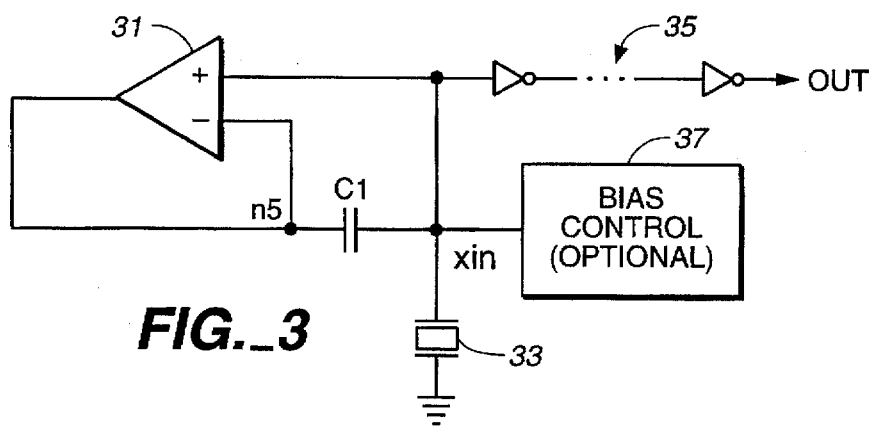
FIG._3
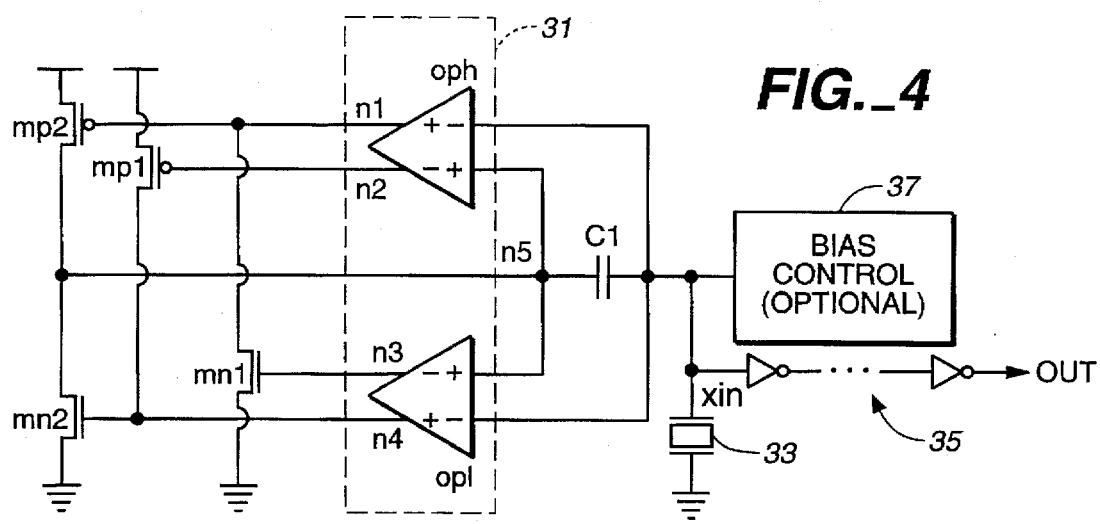
FIG._4
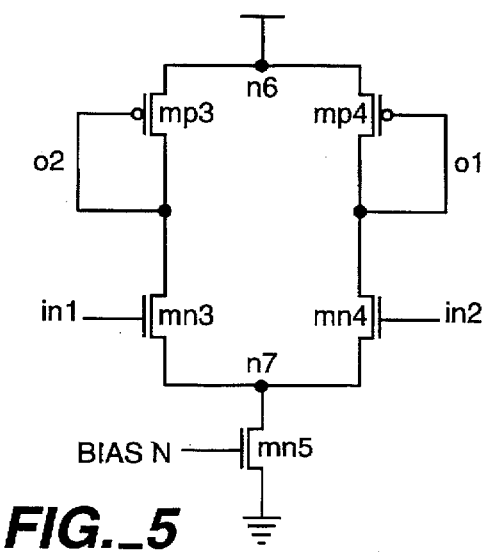
FIG._5
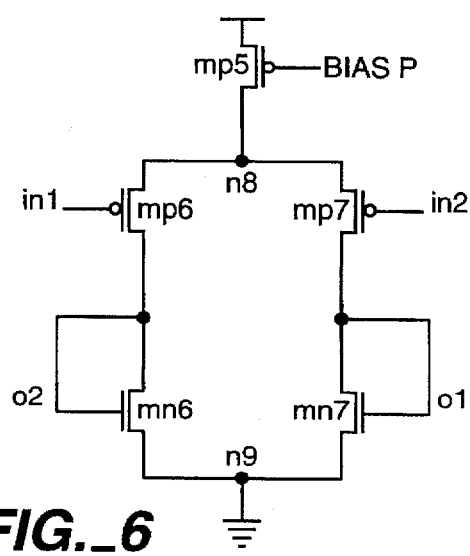
FIG._6

SINGLE PIN CRYSTAL OSCILLATOR CIRCUIT

BACKGROUND OF THE INVENTION

1. Field of the Invention

This invention relates generally to oscillator circuits and more particularly to single pin crystal oscillators.

2. State of the Art

Crystal oscillators are widely used in integrated circuits to generate clock signals for use in various applications in which sequential operations are required. Presently, for high frequency applications, the most commonly used CMOS crystal oscillator circuits require two pin connections to an external crystal, which cannot be integrated on-chip. Referring to FIG. 1, in such a circuit, the external crystal 11E connects across an inverting amplifier 10 connected to a feed-forward resistor R1 and a feedback resistor Rf. The terminals of the external crystal are also connected through respective capacitors C1 (13I/E) and C2 (15I/E) to ground. A buffer chain 17 connected to the feedback resistor Rf produces the final output signal. Because this crystal oscillator circuit involves only one gain stage, it has minimum signal propagation delay within the feedback loop. In FIG. 1 and in succeeding figures, the reference numerals of components external to the chip are followed by the suffix E, and components that may be either external or internal are followed by the suffix I/E. The other components are assumed to be internal.

Modern integrated circuit designs, however, are often pin-count limited, meaning that various functions often compete for I/O pins the number of which is limited by packaging constraints and associated cost considerations, making every I/O pin an important resource. A single additional pin can in many instances allow further attractive features to be added. If more pins can only be obtained at the cost of a more expensive package, however, the benefit may not justify the cost.

Single pin CMOS oscillator circuits are known that offer a savings of one pin. In the single pin CMOS oscillator configuration shown in FIG. 2A, one terminal of a crystal 11E' is connected to the input terminal of a pair of series-connected inverting amplifiers 10 and 12. The terminal of the crystal is also connected through a capacitor C1 to an output terminal of the inverting amplifier 12. The output terminal of the inverting amplifier 10 is coupled back to its input terminal through a feedback resistor Rf1. Similarly, the output terminal of the inverting amplifier 12 is coupled back to its input terminal through a feedback resistor Rf2. The single pin CMOS oscillator configuration of FIG. 2A, using multiple inverter stages, is only used for relatively low-frequency application (f<1 Mhz). The circuit is not operable at high frequencies characteristic of the bulk of today's high-performance integrated circuits.

A further prior art circuit is shown in FIG. 2B. Unlike the circuit of FIG. 2A, the circuit of FIG. 2B uses a single differential amplifier 21 (rather than cascaded single-input buffer stages) and is therefore operable at high speeds. One input terminal of the differential amplifier 21 is connected to an input signal XIN from a crystal (not shown). The other input terminal is connected to a bias signal BIAS1. The output terminal of the differential amplifier 21 is connected to the gate of a P-type MOSFET mp1 connected in series with a second MOSFET mp2, also P-type. The drain of the MOSFET mp1 is connected to an operational voltage, and the source of the MOSFET mp2 is connected to ground. The gate of the MOSFET mp2 is coupled to the drain thereof by a capacitor C1, and is connected also to the input signal XIN. The gate is connected as well through a resistor Rb to a bias signal BIAS2. A buffer chain 23 is connected to same circuit node as the input signal XIN and produces the final output signal.

The circuit of FIG. 2B, although it is operable at high speeds, may not be sufficiently robust as to ensure satisfactory performance over a wide range of process variations and operational conditions. There exists a need for a new CMOS single pin oscillator circuit which can be used in high-frequency and pin-count-limited design, and which is very robust.

SUMMARY OF THE INVENTION

The present invention, generally speaking, provides a robust, single pin oscillator circuit operable at relatively high frequencies as compared to prior art circuits. The oscillator circuit operates across a wide range of voltages and process variations, and provides to an output buffer stage a signal having a relatively large voltage swing, simplifying design. In one embodiment, the frequency range of the oscillator is extended to approximately 50 Mhz, and the oscillator exhibits a self-tracking behavior with respect to the input signal. The oscillator can accept an input signal from an external crystal or can accept any clock signal having a swing of approximately 1 V.

BRIEF DESCRIPTION OF THE DRAWING

The present invention may be further understood from the following description in conjunction with the appended drawing. In the drawing:

FIG. 1 is a simplified schematic diagram of a conventional two-pin CMOS oscillator circuit;

FIG. 2A is a simplified schematic diagram of a conventional, low-frequency, one-pin CMOS oscillator circuit;

FIG. 2B is a simplified schematic diagram of a conventional one-pin CMOS oscillator circuit using a single differential amplifier;

FIG. 3 is a simplified schematic diagram of a high-frequency one-pin oscillator circuit in accordance with one embodiment of the present invention;

FIG. 4 is a more detailed schematic diagram of the oscillator circuit of FIG. 3;

FIG. 5 is a schematic diagram of the differential amplifier oph of FIG. 4; and

FIG. 6 is a schematic diagram of the differential amplifier op1 of FIG. 4.

DETAILED DESCRIPTION OF THE PREFERRED EMBODIMENT

FIG. 3 shows in simplified form the present single pin oscillator circuit. As distinguished from the prior art oscillator circuits of FIG. 1 and FIG. 2A, the single pin oscillator circuit of FIG. 3 employs an amplifier (op amp) 31 having multiple inputs, in particular a positive input and a negative input. A capacitor C1 is coupled between the inputs of the amplifier. An output signal of the amplifier 31 is fed back and is coupled to one plate of the capacitor C1 at a circuit node n5. A crystal 33 is coupled to the opposite plate of the capacitor C1 at a circuit node xin. A signal produced at the circuit node xin is amplified in a buffer circuit 35 having a sufficient number of stages to produce a final output signal that is of the desired signal level. A bias control circuit 37 is optional and may also be coupled to the circuit node xin.

A detailed schematic of the single pin oscillator circuit is shown in FIG. 4. As seen therein, the amplifier of FIG. 3 is realized as two cross-connected differential op amps, oph and op1. The op amps oph and op1 are fully differential, i.e., they have positive and negative input terminals and positive and negative output terminals.

Corresponding output signals from each of the different op amps are applied to the gates of MOSFETS forming a push-pull amplifier pair, one output signal to the MOSFET mp2 and the corresponding output signal to the MOSFET mn2. The push-pull amplifier pair is coupled to the node n5 so as to drive the node.

In addition, the differential op amps are cross coupled in that the output signals of the differential op amps opposite from the output signals described just prior are connected through respective MOSFETS such that both of the MOSFETS in the push-pull amplifier pair are driven by two output signals, one coupled directly from one of the differential op amps and one from the other differential op amp, coupled through a MOSFET. As may be observed from FIG. 4, MOSFETS mp1 and mp2 are both of the P type, and MOSFETS mn1 and mn2 are both of the N type. Assume for a moment that both the differential op amps are active. When the output signal n1 is active low, turning the MOSFET mp2 on, the output signal n4 of the same polarity (active high) will also be low such that the MOSFET mn2 will be turned off. The output signal n3, however, will be high, and will therefore be coupled through the MOSFET mn1, which will be turned on, to additionally drive the MOSFET mp2. The output signal n2, also high, will turn off the MOSFET mp1 and will therefore not be coupled to the MOSFET mn2.

Note, however, that the oscillator circuit will oscillate so long as either one of the differential op amps is active. To make the oscillator circuit very robust, therefore, in a preferred embodiment, the different op amps are of different construction so that the voltage ranges within which the op amps are active only partly overlap. In one embodiment, the op amp op1 is constructed so as to be active when the voltage at node xin is within the range of 0 to 4 volts. When the voltage at node xin is greater than about four volts, the op amp op1 is not active because the voltage is so high at in1 and in2 in FIG. 6 that it turns off transistors mp6 and mp7. The op amp oph is constructed as to be active when the voltage at node xin is within the range of 1–5 volts. Therefore, within the range 0 to 1 volt, only the op amp op1 is active, in the range 1 to 4 volts both om amps are active, and in the range 4 to 5 volts, only the op amp oph is active.

The foregoing characteristic provides an input voltage level self tracing capability. For example, if input xin changes from low to high, with a swing of 0–1 V, the node n4 will go low and the node n3 will go high. Then, the MOSFETS mn1 and mp2 will be turned on; this will result in the node n5 changing from low to high. A 360 degree phase shift and gain required for oscillation are provided by op1 only. The op amp oph is in a non-operational quiescent state. Vice versa, if the input voltage swings between 4–5 V, the op amp op1 is in the non-operational state. If input voltage swings between 1–4 V, both ops amp will work. As a result, no matter what the input signal level is, the output stage of this circuit, MOSFETS mn2 and mp2, always can provide a rail to rail, ±3% duty cycle, clock signal.

The construction of the op amps oph and op1 will now be described with reference to FIG. 5 and FIG. 6, respectively. Referring first to FIG. 5, the op amp oph is formed by a differential pair comprising, in one leg of the circuit, MOSFETS mp3 and mn3 and, in the other leg of the circuit, MOSFETS mp4 and mn4. The sources of MOSFETS mp3 and mp4 are tied to a supply voltage at node n6. The gates of the MOSFETS mp3 and mp4 are tied to their respective drains. The MOSFETS mp3 and mp4 are therefore connected as loads. The MOSFETS mn3 and mn4 have their sources connected to a node n7, and from node n7 through a MOSFET mn5 to ground. The gates of the MOSFETS mn3 and mn4 are connected to input signals in1 and in2 for the op amp oph. A bias signal biasn is connected tO the gate of the MOSFET mn5 and is used to set the tail current of the differential pair.

The op amp op1 of FIG. 6 is of complementary construction to the op amp oph of FIG. 5.

The invention having thus been described, it will be apparent to those of ordinary skill in the art that the invention can be embodied in other specific forms without departing from the spirit or essential character thereof. The disclosed embodiments are therefore considered to be illustrative and not restrictive. The scope of the invention is indicated by the appended claims, and all changes which come within the meaning and range of equivalents thereof are intended to be embraced therein.

What is claimed is:

1. An oscillator circuit formed within an integrated circuit having a package and connectors extending outside said package, said oscillator circuit comprising:

an input lead coupled to a single one of said connectors designated to be connected to a crystal;

a plurality of differential amplifiers which are fully differential, each having multiple input terminals and multiple output terminals, said input lead being coupled to one of said input terminals of each of said differential amplifiers of said plurality;

a feedback path coupled from at least one output terminal to another one of said input terminals; and a buffer coupled to said one of said input terminals, said buffer producing an oscillator output signal.

2. The apparatus of claim 1, further comprising a push-pull amplifier stage coupled to said differential amplifiers and to said feedback path.

3. The apparatus of claim 2, wherein said push-pull amplifier stage comprises a plurality of MOSFETS including a MOSFET of one conduction type and a MOSFET of an opposite conduction type, and wherein each of said MOSFETS is coupled to a voltage supply, to said feedback path, and to an output terminal of at least one of said differential amplifiers.

4. The apparatus of claim 3, wherein each of said MOSFETS is coupled to an output terminal of each of said differential amplifiers.

5. The apparatus of claim 4, wherein each of said MOSFETS is coupled to an output terminal of one of said differential amplifiers directly, and is coupled to an output terminal of another one of said differential amplifiers each through a respective further MOSFET.

6. The apparatus of claim 1, wherein a voltage at said input lead varies over a range 0 to V volts having a plurality of sub-ranges, only one of said differential amplifiers being active over a first sub-range, said one and another one of said differential amplifiers being active over a second sub-range, and only said another one of said differential amplifiers being active over a third sub-range.

7. The apparatus of claim 6, wherein said first sub-range is approximately 0 to 0.2 times V, said second sub-range is approximately 0.2 to 0.8 times V and said third sub-range is approximately. 0.8 to 1 times V.

8. The apparatus of claim 1, further comprising a reactive element coupled between a first one of said input terminals and a second one of said input terminals.

9. The apparatus of claim 8, wherein said reactive element is a capacitor.

10. The apparatus of claim 1, wherein said input lead is coupled to a first one of said input terminals and said feedback path is coupled to a second one of said input terminals.

* * * * *